United States Patent [19]

Baldi

[11] Patent Number: 5,589,701
[45] Date of Patent: Dec. 31, 1996

[54] PROCESS FOR REALIZING P-CHANNEL MOS TRANSISTORS HAVING A LOW THRESHOLD VOLTAGE IN SEMICONDUCTOR INTEGRATED CIRCUITS FOR ANALOG APPLICATIONS

[75] Inventor: Livio Baldi, Milan, Italy

[73] Assignee: SGS-Thomson Microelectronics S.r.l., Agrate Brianza, Italy

[21] Appl. No.: 486,747

[22] Filed: Jun. 7, 1995

Related U.S. Application Data

[62] Division of Ser. No. 282,408, Jul. 28, 1994, Pat. No. 5,534,448.

[51] Int. Cl.⁶ .................................................. H01L 29/76
[52] U.S. Cl. .................. 257/369; 257/372; 257/377; 257/379; 257/381; 257/382; 257/402; 257/412
[58] Field of Search ................................. 259/369, 372, 259/377, 379, 381, 382, 402, 412

[56] References Cited

U.S. PATENT DOCUMENTS

| | | | |
|---|---|---|---|
| 3,673,471 | 6/1972 | Klein et al. | 317/235 R |
| 4,703,552 | 11/1987 | Baldi et al. | 437/45 |
| 4,890,141 | 12/1989 | Tang et al. | 257/372 |
| 5,025,230 | 6/1991 | Kondo | 257/372 |
| 5,091,324 | 2/1992 | Hsu et al. | 437/34 |
| 5,171,699 | 12/1992 | Hutter et al. | 437/41 |
| 5,304,502 | 4/1994 | Hanagasaki | 437/41 |

FOREIGN PATENT DOCUMENTS

| | | | |
|---|---|---|---|
| 017899A3 | 10/1985 | European Pat. Off. | H01L 27/08 |
| 0356202A2 | 8/1989 | European Pat. Off. | H01L 21/336 |
| 0402784A2 | 6/1990 | European Pat. Off. | H01L 21/28 |
| 0414400A2 | 8/1990 | European Pat. Off. | H01L 29/62 |
| 0520209A1 | 6/1992 | European Pat. Off. | H01L 27/092 |
| 2933849 | 8/1979 | Germany | H01L 29/76 |

OTHER PUBLICATIONS

Davari et al., "A High Performance 0.25 μm CMOS Technology", IEEE, Jan. 1988.

Nygren et al., "Dual-Type CMOS Gate Electrodes by Dopant Diffusion from Silicide", *IEEE Transactions on Electron Devices*, vol. 36, No. 6, Jun. 1989.

Primary Examiner—Edward Wojciechowicz
Attorney, Agent, or Firm—Seed And Berry LLP; David V. Carlson

[57] ABSTRACT

A process for forming low threshold voltage P-channel MOS transistors in semiconductor integrated circuits for analog applications, said circuits including high resistivity resistors formed in a layer of polycrystalline silicon and N-channel MOS transistors having active areas which have been obtained by implantation in a P-type well, comprises the steps of, providing a first mask over both said resistors and the semiconductor regions where the low threshold voltage P-channel transistors are to be formed, doping the polycrystalline layer uncovered by said first mask, providing a second mask for protecting the resistors and the semiconductor regions where said low threshold voltage P-channel transistors are to be formed, and N+ implanting the active areas of the N-channel transistors.

9 Claims, 4 Drawing Sheets

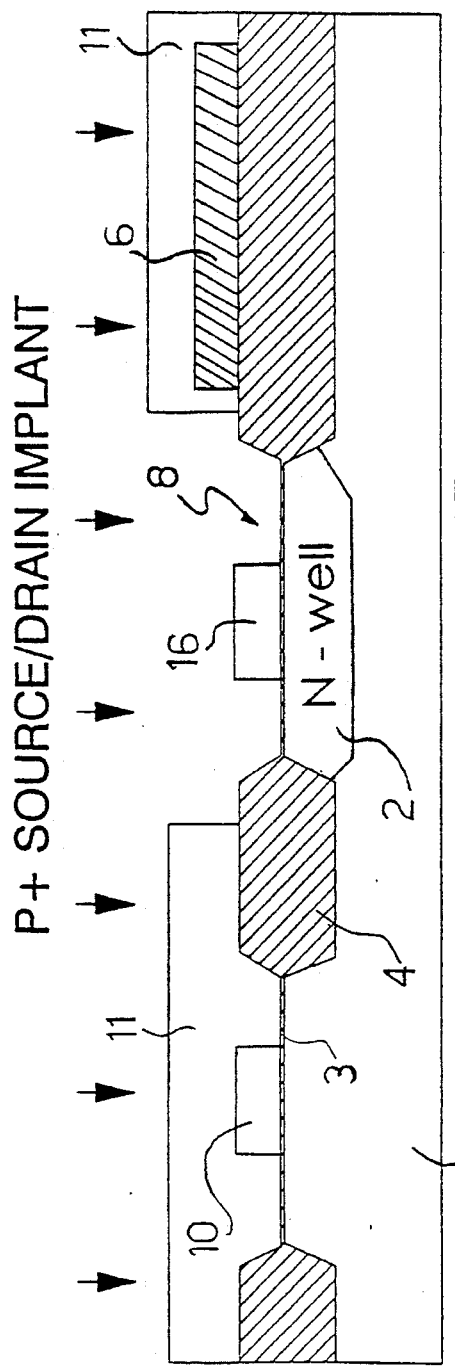
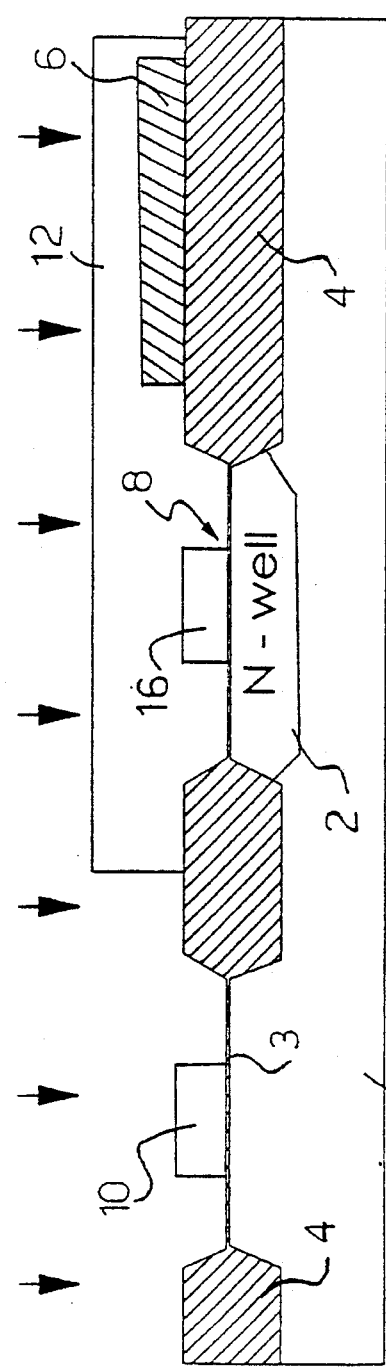
FIG. -3 PRIOR ART
FIG. -4 PRIOR ART

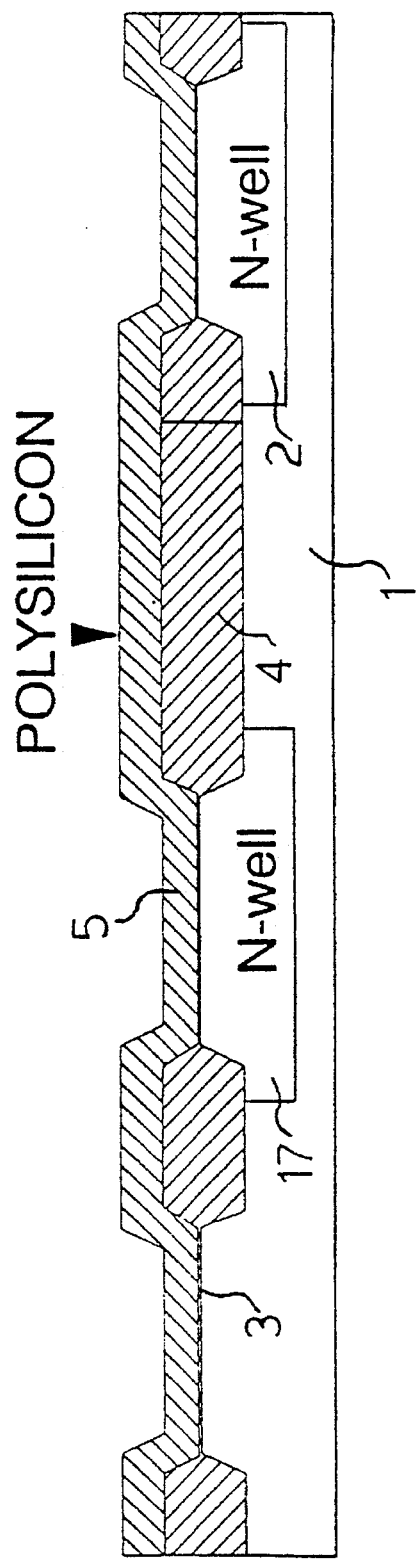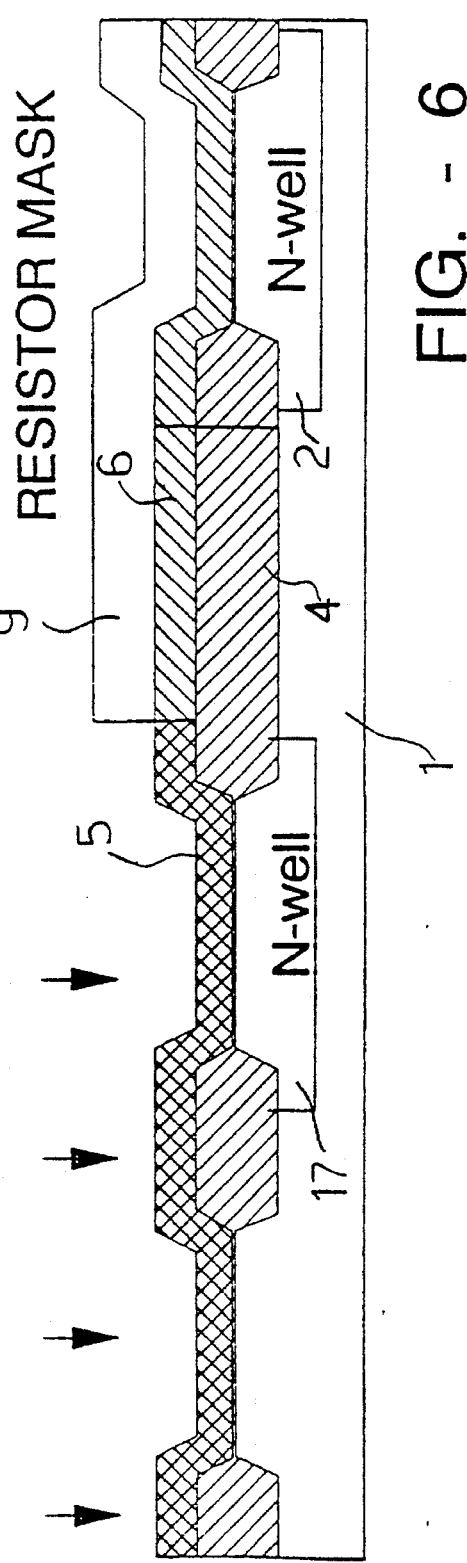

PROCESS FOR REALIZING P-CHANNEL MOS TRANSISTORS HAVING A LOW THRESHOLD VOLTAGE IN SEMICONDUCTOR INTEGRATED CIRCUITS FOR ANALOG APPLICATIONS

RELATED APPLICATIONS

This application is a divisional application of application Ser. No. 08/282,408 filed Jul. 28, 1994 now U.S. Pat. No. 5,534,448.

FIELD OF THE INVENTION

This invention relates to a process for forming low threshold voltage P-channel MOS transistors in semiconductor integrated circuits for analog applications.

BACKGROUND OF THE INVENTION

As is well known, CMOS processes are widely used to manufacture devices for analog applications, in view of the low power consumption and high integration density features of MOS devices compared to bipolar transistors.

A prerequisite is, however, that the basic CMOS process be modified by the addition of new options, namely:

high linearity capacitors (approximately 50 ppm/V, with a specific capacitance of 0.5 to 1 pF/µm$^2$);

high specific value precision resistors (approximately 1 to 2 kohm/square); and low threshold MOS transistors (below 0.8 V).

High linearity capacitors are either formed between two layers of polycrystalline silicon or between a layer of polycrystalline silicon and a diffusion. To provide the required linearity values, they require very heavy doping of both electrodes.

Precision resistors are formed in a lightly doped layer of slightly doped polycrystalline silicon, which is normally obtained, protecting the gate polysilicon from the N+ doping through an appropriate oxide mask.

As to MOS transistors having polysilicon gate terminals, it is fairly difficult to obtain low threshold voltages and small gaps between the source and drain active regions, at one time and in both transistors of the CMOS pair.

Both these features are attractive in any transistor type, because they allow low supply voltages to be used while still affording high speed of response and high integration densities.

Analog applications specifically require that transistors with low threshold voltages be used, both for improved linearity of response and on account of the present trend toward lower power requirements. To fully appreciate the aspects of this invention, mention should be made of the expedients that may be used to produce low threshold voltage transistors.

A first reference is the work by A. S. Grove, "Physics and Technology of Semiconductor Devices", published by Wiley, where the threshold voltage of an MOS transistor is expressed as a function of characteristic parameters:

$$V_T = V_{FB} + \Phi_s + \sqrt{\left(2 K_s \epsilon_o q N \Phi_s\right)}/Co \qquad (1)$$

where:

$V_T$ is the threshold, $V_{FB}$ is the flat band voltage, $\Phi_S$ is the surface potential of the substrate, $K_s$ is the silicon dielectric constant, $\epsilon o$ is the vacuum dielectric constant, q is the electron charge, N is the concentration of dopant in the region which is to accommodate the transistor, and Co is the capacity per square of the gate dielectric surface.

In this relation, the sign (−) denotes P-channel transistors and the sign (+) N-channel transistors. Accordingly, the threshold voltage will be negative for the P-channel transistors and positive for N-channel ones.

The value of the threshold voltage depends on the three terms which appear in the right-hand part of the relation (1).

In the N-channel transistors of conventional CMOS devices, two terms have opposite signs, namely $V_{FB}$ is negative whereas $\Phi_s$ is positive, and they cancel each other almost completely.

It follows that the threshold voltage will solely be dependent on the third term, which can lead to $V_T$ taking the desired value by variation.

For instance, in standard CMOS processes wherein the gate terminal of an N-channel transistor is formed by a polycrystalline layer doped with phosphorus, fairly low threshold voltages of about 0.3 to 0.5 Volts can be obtained.

In the instance of the P-channel transistors of CMOS devices, on the other hand, both terms $V_{FB}$ and $\Phi_s$ are negative and the third term, which is positive, is preceded by the minus sign. Therefore, all these terms will make a non-negligible contribution to the value of the threshold voltage. In any event, the value of $V_T$ will never drop below the modulo of the sum of the first two terms.

In general, threshold voltages on the order of −1.5 to −1.7 Volts can be obtained for P-channel MOS transistors.

The threshold voltages thus obtained are inadequate for normal applications, whether digital or analog. Therefore, the thresholds of N-channel transistors should be raised and those of P-channel transistors lowered. This can be accomplished by manipulating the third term of equation (1) in order to alter the surface concentration of N-dopant. Thus, the threshold of N-channel transistors must be raised, and this is accomplished by an additional implantation of boron just beneath the gate oxide.

With P-channel transistors, on the contrary, the dopant concentration must be reduced, and this is accomplished by an appropriate implantation of boron compensating the substrate N-doping. However, some problems are encountered in so doing.

In fact, when the concentration of N-dopant is greatly reduced in the substrate of P-channel transistors, under certain bias conditions a deep conductive channel may be formed at gate voltages below the threshold voltage (a phenomenon called "punch-through"). It therefore becomes impossible to control the transistor.

This problem may be avoided by increasing the gap between the source and drain regions of the P-channel transistor.

In this way, however, the transistor length is increased, which results in decreased integration density and speed of response.

Furthermore, in the instance of enhanced reduction of the threshold voltage and formation of the deep channel, even an increase of the channel length may prove ineffective to control the transistor current loss, in spite of the gate being grounded.

To lower the threshold voltage of P-channel transistors one might act on the flat band voltage $V_{FB}$. As previously mentioned, this voltage is a negative one, but to significantly lower the threshold $V_T$ it would have been convenient if such band voltage was positive.

As the skilled person in the art knows well, the flat band voltage is substantially related to the difference between the Fermi energy of the substrate which is to accommodate the transistor and the Fermi energy of the gate electrode. Further, the flat band voltage is expressed in the following relation:

$$V_{FB} = \Phi_{MS} - Q_F/C_o \tag{2}$$

where:

$\Phi_{MS}$ = the difference between the gate electrode work function and the silicon substrate work function, $Q_F$ = fixed charge of the gate dielectric, and $C_O$ = capacitance of the gate dielectric.

In a P-channel transistor, the substrate is an N type, which means that its Fermi level is shifted toward the conduction band, e.g. toward high energy levels. Where a transistor of that kind is incorporated in a CMOS device with polysilicon gate terminals, the layer of polycrystalline silicon is usually an N+ type, which means that its Fermi energy lies even closer to the conduction band than that of the substrate.

Accordingly, the Fermi energy of the substrate is lower than that of the gate electrode and the flat band voltage will take a negative value of about −250 mV.

To make this value a positive one, e.g. of about 750 mV, it is necessary to shift the Fermi energy of the gate electrode toward the valency band, that is toward energy levels lower than those of the substrate. This involves heavy doping of the polycrystalline silicon with impurities of the P+ type.

When a positive flat band voltage is used in a P-channel transistor, a sufficiently low threshold voltage can be obtained even if a fairly high proportion of the dopant is left over in the substrate. Thus, such an approach would yield a P-channel transistor having a low threshold voltage and a small gap between the active regions.

SUMMARY OF THE INVENTION

The underlying technical problem solved by the present invention is to provide a process for forming P-channel MOS transistors with a low threshold voltage in a manner easily compatible with the requirements of CMOS technology integrated circuits for analog applications.

In particular, the invention concerns a process for forming low threshold voltage P-channel MOS transistors in semiconductor integrated circuits, for analog applications, which include high resistivity resistors formed in a layer of polycrystalline silicon, P-channel MOS transistors with threshold voltages higher than that of the low threshold voltage P-channel MOS transistors, and N-channel MOS transistors with active areas obtained by implantation.

The present invention provides for a first process step of masking those circuit areas where the low-threshold P-channel transistors are to be formed using the same oxide mask which has been used to define the areas for the precision resistors, while the polycrystalline silicon is being doped with POCl₃, and a second step of masking those same areas during the N+ implantation of the drain and source regions of the N-channel transistors. The second mask is removed just for the P-channel transistors during the P+ implantation of their source and drain regions.

Based on such a solutive idea, the technical problem is solved by a process as previously indicated and as defined in the characterizing part of claim 1.

BRIEF DESCRIPTION OF THE DRAWINGS

The features and advantages of a process according to the invention will become apparent from the following description of an embodiment thereof, given by way of example and not of limitation with reference to the accompanying drawings, in which FIGS. 1 to 4 show, drawn to an enlarged scale and in vertical section, respective schematic views of a semiconductor substrate portion to which preparatory steps of the inventive process are conventionally applied in timed sequence; and FIGS. 5 to 8 show, drawn to an enlarged scale and in vertical section, respective schematic views of the semiconductor substrate portion in FIGS. 1 and 2 to which the steps of the inventive process are applied in timed sequence.

DETAILED DESCRIPTION OF THE INVENTION

Figure 1:
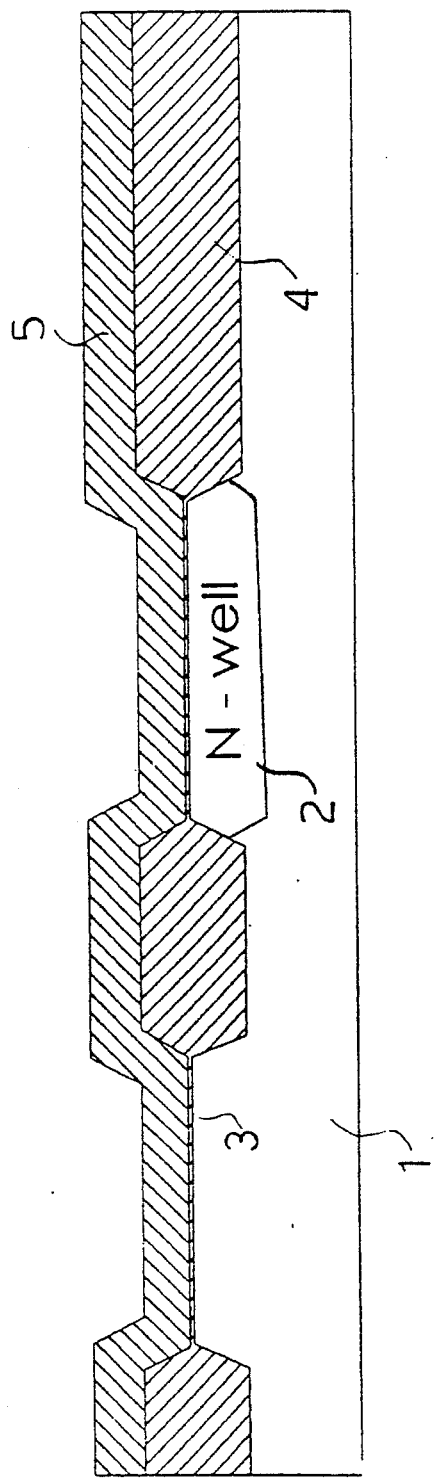

With reference to the drawing views, generally and schematically shown at 1 is a substrate of a semiconductor material on which both N-channel and P-channel MOS transistors are formed by CMOS technology process steps.

More particularly, formed on the substrate 1 in the form of an integrated circuit are CMOS technology devices for use in analog applications.

The first steps of the process are commonplace in the related art, and may be regarded as preparatory for the purposes of this invention.

The process follows the guidelines of a standard CMOS process as to the formation of P and N wells (in the instance of a two-well process), the definition of the active areas, the formation of the field oxide, and the growing of a sacrificial oxide.

Thereafter, the active area regions are defined, using an appropriate resist mask where tile capacitors are to be formed, with the assumption that a diffusion through the substrate would be used for the lower electrode.

Phosphorus is then implanted at a high energy and in very large amounts (>$10^{15}$ at/cm²) to form the lower electrode of the capacitor. The sacrificial oxide is subsequently removed, and the gate oxide grown to a thickness on the implanted areas not too different from the standard gate thickness.

Boron is then implanted to adjust the threshold voltages of the N-channel and P-channel transistors to desired values, using additional masks and implantations to provide the low threshold voltage transistors.

Subsequent to this, a layer of polycrystalline silicon is implanted, preferably with low-energy boron, to provide resistors having desired values.

A vapox or protective oxide layer is then vapor phase deposited over the polycrystalline silicon and masked to only leave those regions exposed where the precision resistors are to be formed. Next, the polycrystalline silicon is doped from a liquid source of POCl₃, while in a kiln, to yield high dopant concentrations as necessary for good linearity of the capacitors.

The process is then carried further through standard CMOS process steps, which accommodate many modifications. In all events, the points in common would be the following:

the polycrystalline silicon used for the capacitors and the gate terminals should be heavily doped to produce the linearity sought;

the regions where the precision resistors are formed should be suitably masked from this as well as other dopages to follow; and layers of refractory metal silicides cannot be used because of incompatibility with the precision resistors and capacitors.

The process steps just described will now be reviewed with specific reference to the accompanying drawings.

In the substrate 1 is first formed a diffused well 2 of the N type, wherein active areas, such as a low threshold voltage transistor 8 of the P-channel MOS type, will be formed later.

Then, field oxide regions 4 are realized, which isolate the active areas, that is those semiconductor portions on which transistors and capacitors are realized. The capacitors, being of a conventional type, are not shown in the drawings.

A thin gate oxide layer 3 is then grown on the active areas. A further boron implantation without masking is performed to adjust the transistors' thresholds, for N-Channel or P-Channel, around the desired values, as explained before.

A layer 5 of polycrystalline silicon is deposited over the oxide layers 3 and 4, as shown in FIG. 1.

At this point, a portion 6 of the polycrystalline layer 5 is doped to provide high-resistivity resistors 6, for instance by a low-energy boron implantation with a dose of $5*10^{14}$ at/cm$^2$. Afterward, a protective oxide layer 7 is deposited over the polycrystalline layer 5.

Figure 2:
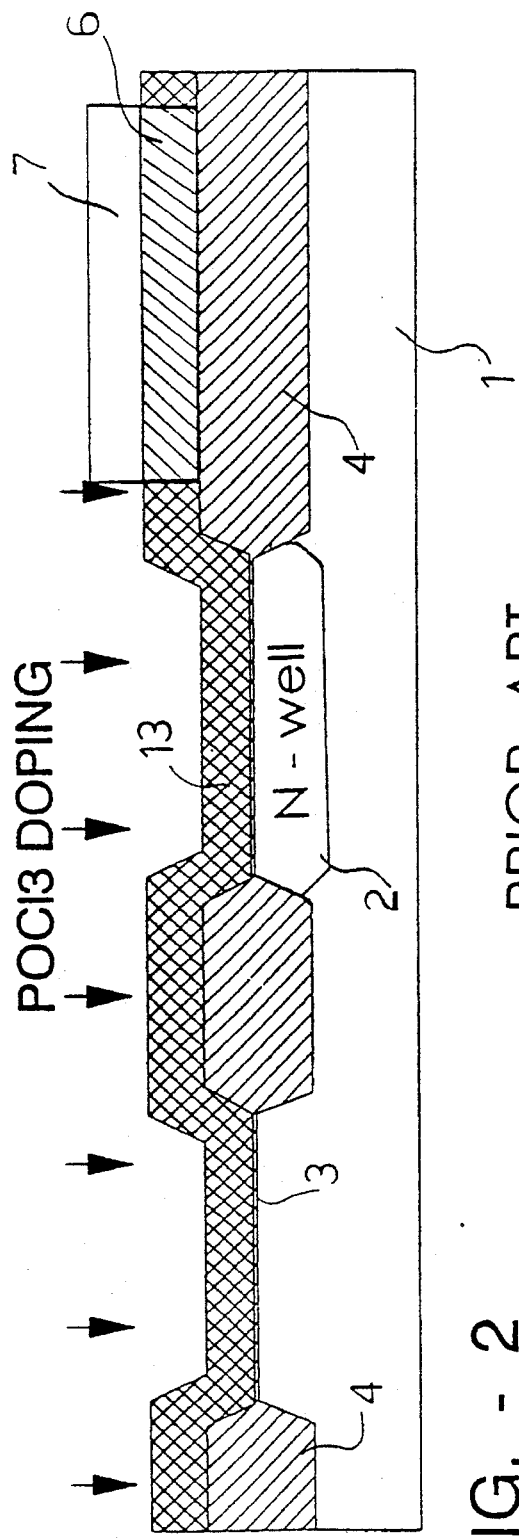
Figure 7:
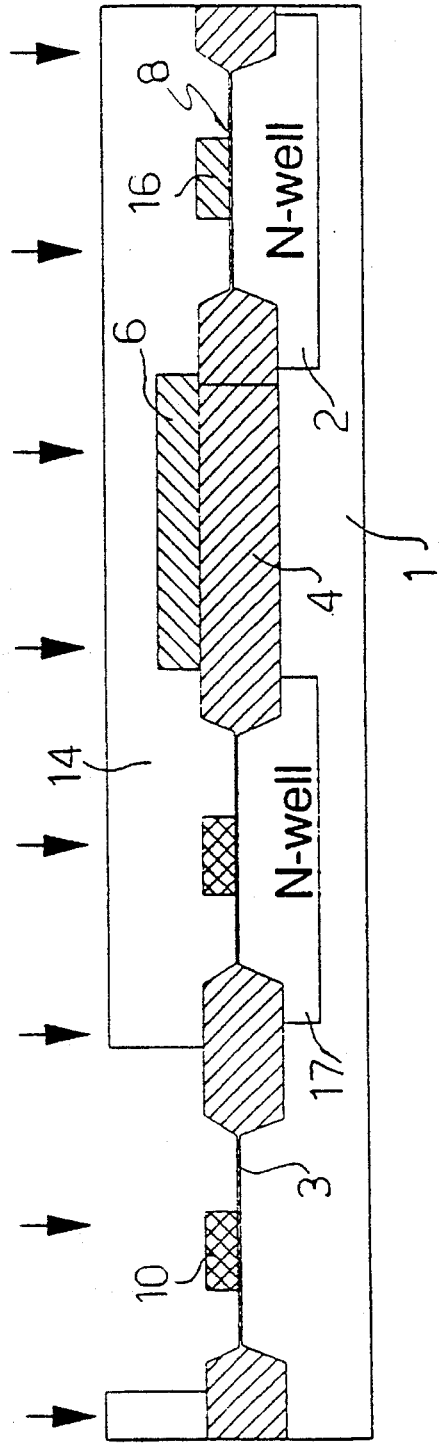
Figure 8:
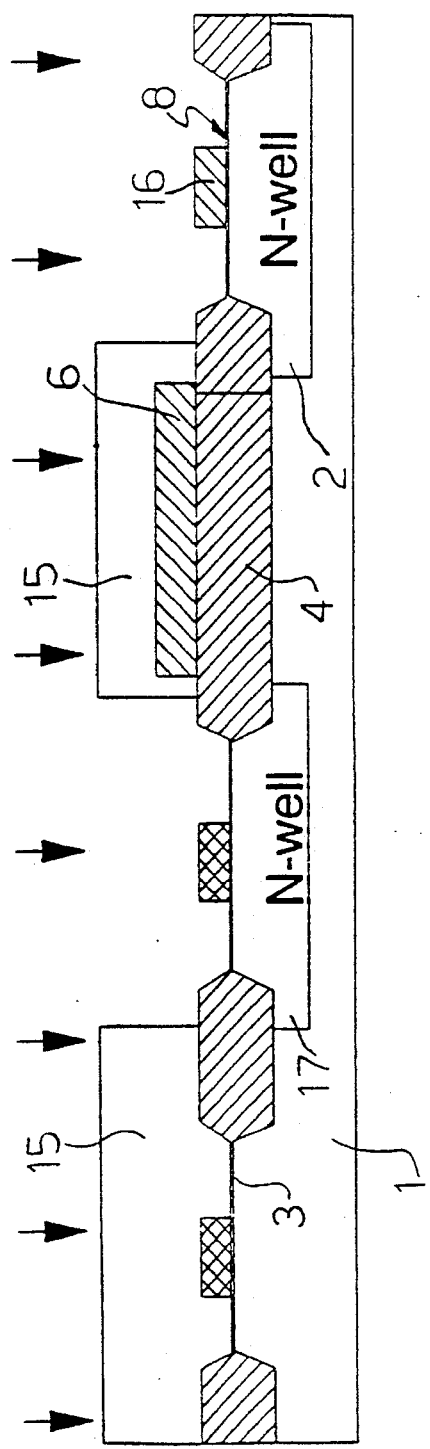

By masking the regions where the resistors 6 must be formed, followed by etching, the polycrystalline layer 5 can be once again exposed to have it doped with POCl$_3$, as shown in FIG. 2. In such a figure the polycrystalline layer thus doped is denoted by the numeral 13.

The CMOS technology process is then carried further in a basically conventional manner up to the definition of the gate terminals 10 and 16 for the various transistors. Thereafter, dopages for implanting the source and drain active areas of such transistors are selectively performed.

In this respect, a mask 11 for both the resistors 6 and the N-channel MOS transistors is provided to enable P+ implantation of the source and drain active areas of the P-channel transistors 8 in the well 2.

Likewise, a mask 12 for the resistors 6 and the P-channel transistors 8 allows N− implantation of the source and drain active areas of the N-channel transistors, as shown in FIGS. 3 and 4.

Now, with specific reference to FIGS. 5 to 8, the process phases according to the invention which distinguish the inventive solution from the prior art are disclosed.

FIG. 5 corresponds substantially to FIG. 1 as to the semiconductor topography and the sequence of the process phases which draw to the realization of such a topography. The only difference is given by the presence of a second N-well 17.

The inventive process is distinguished from the prior art starting from the POCl$_3$ doping phase of the polysilicon layer.

Before doing such a doping, the invention provides for a masking protection of those circuit areas on which low threshold voltage P-channel transistors 8 and resistors 6 are to be realized.

Preferably, this first masking is obtained by extending the masking surface already provided to protect the resistors 6 areas.

FIG. 6 shows a portion of a silicon oxide mask 9 designed to cover both an area in which a resistor 6 must be realized and a portion overlapping an N-well 2 in which a low threshold voltage P-Channel transistor 8 and its gate terminal 16 must be realized.

The process steps continue with the doping of the polysilicon left exposed, followed by removal of the mask 9. The various gate terminals 10 of the N-channel transistors and P-channel transistors 8 and the gate terminals 16 of the low threshold voltage P-channel transistors 8 are defined next.

There follows then a step of N+ implantation to form the source and drain active areas of the N-channel transistors.

According to the invention, a second protective mask 14 is formed over the P-channel transistors and the resistors 6 before this N+ implant step.

The mask 14 is removed on completion of the N+ implant step.

A further mask 15 is arranged to cover those areas where the N-channel transistors and resistors 6 have been formed.

The polycrystalline silicon areas where the resistors 6 have been formed are always masked and protected during the implant steps which result in the active areas of both the N-channel and the P-channel transistors being defined.

On the other hand, those circuit areas where the low-voltage P-channel transistors have been formed are masked both during the step of POCl$_3$ implanting the polycrystalline silicon and the step of implanting with N+ ions as needed to provide the source and drain active areas of the N-channel transistors.

These circuit areas, therefore, will only be left unprotected during the P+ implantation that provides the source and drain regions of ordinary P-channel transistors, in all cases present in the circuit, and the same low threshold voltage P-channel transistors 8.

Thus, in these areas, the P-channel transistors will undergo a doping step which also involves their gate terminals 10.

This feature also affects the threshold voltage characteristics of the resultant transistors 8 to the point that they have measured threshold voltage values in the range of about −0.3 to −0.4 volts if they are subjected to the same implant step effective to adjust or compensate the N-channel threshold voltage value around 0.7 to 0.8 V.

When the transistors 8 formed in accordance with the inventive process are also masked during this additional implant step, threshold voltages on the order of −0.7 to −0.8 Volts can be obtained.

The low threshold voltages in P-Channel transistors so obtained are attributable to an alteration in the work function difference between the gate terminal and the substrate, with no alteration occurring to the distribution of dopant through the substrate.

Below the threshold, the characteristics of the transistors to be obtained by this invention will correspond to those of ordinary P-channel transistors, which have much higher threshold voltages and N-doped gate terminals.

Thus, the process of this invention solves the technical problem and provides P-channel MOS transistors which have low threshold voltages and are compatible to the technologies used to make integrated circuits for analog applications.

All this is accomplished without the aid of additional masks.

P-channel MOS transistors with low threshold voltages are only integrated to predetermined areas of a CMOS circuit intended for analog applications. Such transistors represent but a minor proportion of the total number of transistors provided in the integrated circuit.

The P-channel transistors are easy to locate within the circuit and, at the designing stage, individual metallic contacts can be provided for them which will produce no inordinate expansion of the circuit area.

Changes and modifications may be made to the process described and illustrated in the foregoing without departing from the invention scope as defined in the appended claims.

I claim:

1. A CMOS integrated circuit for analog applications comprising:

a substrate of semiconductor material having a uniform first doping level and a uniform first work function;

a plurality of N-channel transistors;

a plurality of first P-channel transistors having a first threshold voltage, said first P-channel transistors having gate electrodes comprised solely of polysilicon, the polysilicon having a second doping level and a second work function, the second doping level being less than the first doping level, the second work function being less than the first work function, such that said first P-channel transistors have a positive flat band voltage; and a plurality of second P-channel transistors having gate electrodes comprised solely of polysilicon having a different doping level than the second doping level of the first plurality of P-channel transistors the second P-channel transistors having a second threshold voltage, the second threshold voltage having an absolute value higher than the first threshold voltage.

2. The integrated circuit of claim 1 wherein:

the absolute value of the first threshold voltage is not greater than 0.8 V.

3. The integrated circuit of claim 1 wherein:

the flat band voltage has a value of about 750 mV.

4. The integrated circuit of claim 1, further comprising:

a first metallization layer that connects the gate electrodes of said first P-channel transistors to remaining portions of the integrated circuit.

5. The integrated circuit of claim 1, further comprising:

ohmic contact terminals that connects said impedance devices to remaining portions of the integrated circuit.

6. The integrated circuit of claim 1 wherein:

said substrate has N dopant;

said N-channel transistors have polysilicon layers with N+ dopant within their gate electrodes; and the polysilicon layer in the gate electrodes of said first P-channel transistors has P+ dopant.

7. An integrated circuit structure comprising:

a substrate of N-type semiconductor material;

a plurality of N wells having a uniform first doping level and a first work function;

a plurality of polysilicon impedence devices formed on said substrate;

a plurality of N-channel transistors formed in said integrated circuit; and a plurality of first P-channel transistors with a first threshold voltage formed in said N wells, each of said first P-channel transistors having a polysilicon gate electrode, the polysilicon layer having dopant at a second doping level and a second work function, the second doping level being lower than the uniform first doping level, the second work function being less than the first work function, such that said first P-channel transistors have a positive flat band voltage.

8. The structure of claim 7, further comprising:

a plurality of second P-channel transistors with a second threshold voltage formed in said N-wells, each of said second P-channel transistors having a polysilicon layer as part of its electrode, the polysilicon layer having dopant at a third doping level, the third doping level being between the first and second doping levels, such that the second threshold voltage has an absolute value higher than the first threshold voltage.

9. The integrated circuit of claim 7 wherein:

said N wells have N− dopant;

said N-channel transistors have polysilicon layers with N+ dopant within their gate electrodes; and the polysilicon layer in the gate electrodes of said first P-channel transistors has P+ dopant.

* * * * *